US006849933B2

(12) United States Patent
Koike et al.

(10) Patent No.: US 6,849,933 B2
(45) Date of Patent: Feb. 1, 2005

(54) SEMICONDUCTOR MOUNTING DEVICE AND METHOD OF MANUFACTURING THE SAME

(75) Inventors: Nobuya Koike, Maebashi (JP); Ichio Shimizu, Tamamura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/188,805

(22) Filed: Jul. 5, 2002

(65) Prior Publication Data

US 2003/0020162 A1 Jan. 30, 2003

(30) Foreign Application Priority Data

Jul. 13, 2001 (JP) ........................................ 2001-213975

(51) Int. Cl.[7] ........................ H01L 23/495; H01L 23/10; H01L 23/34
(52) U.S. Cl. ........................ 257/676; 666/706; 666/707
(58) Field of Search ................................ 257/673–676, 257/706–707, 666, 713–717, 796

(56) References Cited

U.S. PATENT DOCUMENTS 5,892,278 A * 4/1999 Horita et al. ............... 257/706
6,198,163 B1   3/2001 Crowley et al. ............ 257/706
6,246,111 B1 * 6/2001 Huang et al. ............... 257/675

FOREIGN PATENT DOCUMENTS

JP        6-295963     10/1994

\* cited by examiner

*Primary Examiner*—Cuong Nguyen
(74) *Attorney, Agent, or Firm*—Miles & Stockbridge P.C.

(57) ABSTRACT

A semiconductor device of a high heat radiation type having improved reliability is disclosed. The semiconductor device comprises a semiconductor chip with plural bonding pads formed thereon, plural inner leads, plural bonding wires for connecting the bonding pads and the inner leads with each other, a heat spreader having a chip supporting surface for supporting the semiconductor chip and also having a rear surface exposed to the exterior, a chip bonding material for bonding the semiconductor chip and the heat spreader with each other, a resin body which seals the semiconductor chip with a sealing resin, and plural outer leads projecting to the exterior from the resin body. A protruding portion protruding upward from the chip supporting surface is formed around the chip on the chip supporting surface of the heat spreader, thereby relieving a thermal stress imposed on an end portion of the chip bonding material and improving the reliability of a QFP as the semiconductor device.

10 Claims, 15 Drawing Sheets

SEMICONDUCTOR MOUNTING DEVICE AND METHOD OF MANUFACTURING THE SAME

BACKGROUND OF THE INVENTION

The present invention relates to a semiconductor device manufacturing technique and more particularly to a technique which is effective in improving the reliability of a resin-sealed and high heat radiation type semiconductor device having a heat sink.

In the automobile field in which the mounting of a highly reliable IC (Integrated Circuit) is required, the demand for surface-mounted type packages is now increasing in quick tempo. Particularly, the demand for high heat radiation type surface-mounted packages is conspicuous.

As a high heat radiation type surface-mounted package there is known a package of a structure provided with a heat sink called a heat spreader, which heat spreader is exposed from resin to enhance the heat radiating performance.

In this known package, in order to transmit the heat generated from a semiconductor chip efficiently to the heat spreader, there mainly is used solder or silver paste high in thermal conductivity as a chip bonding material which is a die bonding material.

As to the structure of a semiconductor device having a heat sink or a heat radiating block, as well as a method of manufacturing the same, a related description is found, for example, in Japanese Published Unexamined Patent Application No. Hei 6(1994)-295963. In this publication there is described a technique in which a U-shaped groove or a bottomed hole having a return portion is formed in a heat sink or a heat radiating block and, at the time of sealing with resin, the resin is allowed to bite into the U-shaped groove or the bottomed hole having a return portion to improve the adhesion between the heat sink or the heat radiating block and the resin.

SUMMARY OF THE INVENTION

However, the present inventor has found out that according to the technique disclosed in the foregoing unexamined publication the adhesion between the heat sink or the heat radiating block and the resin is not satisfactory against a thermal stress which is induced in a temperature cycle test or by reflow in substrate mounting.

More particularly, in a surface-mounted type package of a structure in which a heat spreader as a heat radiating member is exposed from resin, a thermal stress induced due to a difference in thermal expansion coefficient between the heat spreader and the resin is very large, so with only the technique disclosed in the foregoing unexamined publication it is presumed difficult to avoid peeling-off of the bonding portion between the heat spreader and the resin caused by the thermal stress.

Once the bonded portion between the heat spreader and the resin peels off, all the stress concentrates on the chip bonding material which is a die bonding material and there arises the problem that the reliability as a surface-mounted type package is deteriorated.

It is an object of the present invention to provide a semiconductor device of a high heat radiation type which can attain the improvement of reliability, as well as a method of manufacturing the same.

The above and other objects and novel features of the present invention will become apparent from the following description and the accompanying drawings.

As to typical modes disclosed herein, a brief description will be given below.

In one aspect of the present invention there is provided a semiconductor device comprising a semiconductor chip formed with plural bonding pads, plural inner leads arranged around the semiconductor chip, plural connecting members for respectively connecting the plural bonding pads and the plural inner leads with each other, a chip mounting portion having a chip supporting surface for supporting the semiconductor chip and also having a rear surface positioned on the side opposite to the chip supporting surface and exposed to the exterior, a chip bonding material for bonding the semiconductor chip and the chip mounting portion with each other, a resin body having a chip side sealing portion disposed sideways of the semiconductor chip to seal the chip, and plural outer leads projecting from the resin body, wherein a protruding portion protruding from the chip supporting surface of the chip mounting portion is formed around the chip on the chip supporting surface.

In another aspect of the present invention there is provided a method of manufacturing a semiconductor device, comprising the steps of providing a lead frame, the lead frame comprising a multi-heat sink and a multi-frame bonded together, the multi-heat sink having plural chip mounting portions each formed with a protruding portion protruding from a chip supporting surface, the multi-frame having inner leads and outer leads; mounting a semiconductor chip on the chip supporting surface of each of the chip mounting portions through a chip bonding material; disposing each of the chip mounting portions on a bonding stage, thereafter disposing the inner leads outside the protruding portion of the chip mounting portion, clamping the chip mounting portion and the inner leads in such a manner that both are put in contact with each other, and in this state, transmitting heat to the inner leads from the bonding stage through the chip mounting portion to connect bonding pads on the semiconductor chip and the inner leads with each other through bonding wires; thereafter releasing the clamped state to separate the chip mounting portion and the inner leads from each other; sealing the semiconductor chip with resin to form a resin body so that the side opposite to the chip supporting surface of the chip mounting portion is exposed to the exterior.

DETAILED DESCRIPTION OF PREFERRED EMBODIMENTS

Figure 1:
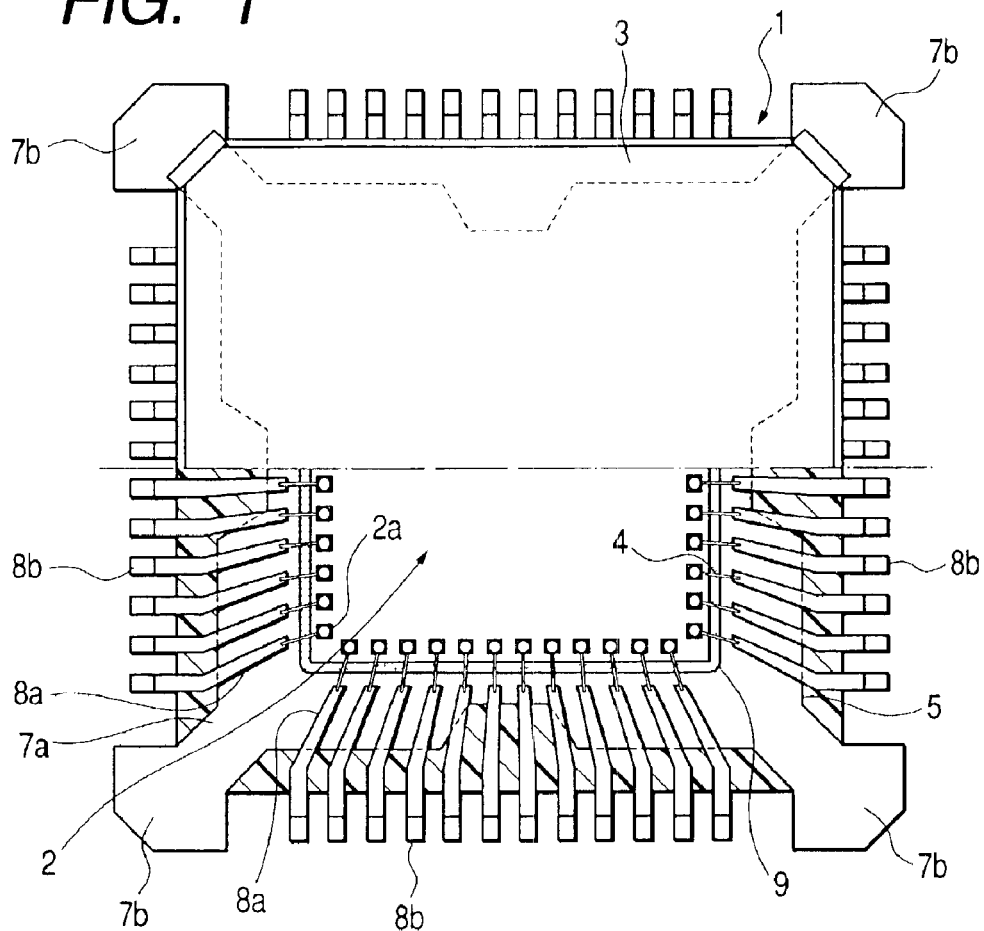
FIG. 1 is a partially cut-away plan view showing a structural example of a semiconductor device according to a first embodiment of the present invention.

Embodiments of the present invention will be described in detail hereinunder with reference to the accompanying drawings.

If necessary for convenience sake, the following description will be divided into plural sections or modes, which, however, are not irrelevant to each other, but, for example, one is a modified example, the details, or a supplementary explanation of a part or the whole of the other(s) unless otherwise specified.

When reference is made to, for example, the number of elements (including the number of pieces, numerical value, quantity, and range) in the following embodiments, no limitation is made to the specific value referred to, but values above and below the specific values will do unless otherwise specified and except the case where a limitation is made to the specific value basically obviously.

It goes without saying that the components (including elemental steps) in the following embodiments are not always essential unless otherwise specified and except the case where they are considered essential basically obviously.

Likewise, it is to be understood that when reference is made to the shape and positional relation of components in the following embodiments, shapes and positional relations similar thereto substantially closely or merely similar thereto are also included unless otherwise specified and except the case where they are dissimilar basically obviously. This is also true of the foregoing numerical value and range.

Further, in all of the drawings for explaining the embodiments, portions having the same functions are identified by the same reference numerals and repeated explanations thereof will be omitted.

First Embodiment

Figure 2:
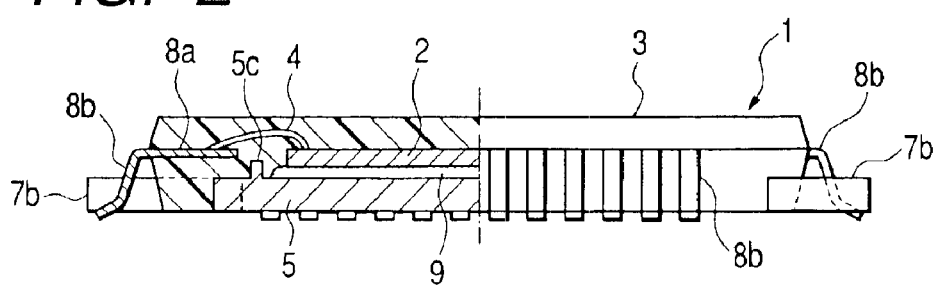
FIG. 2 is a partially cut-away side view showing the structure of the semiconductor device illustrated in FIG. 1.
Figure 3:
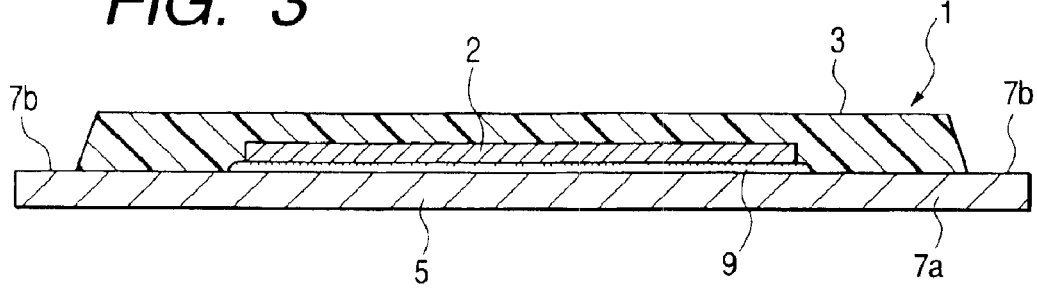
FIG. 3 is a sectional view showing the structure in a diagonal direction of the semiconductor device illustrated in FIG. 1.
Figure 4:
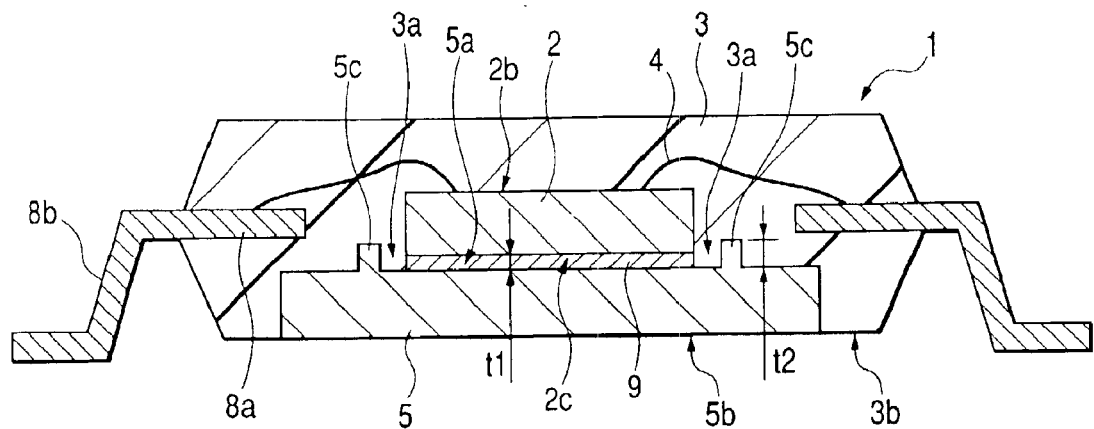
FIG. 4 is a sectional view showing the structure of the semiconductor device illustrated in FIG. 1.
Figure 5:
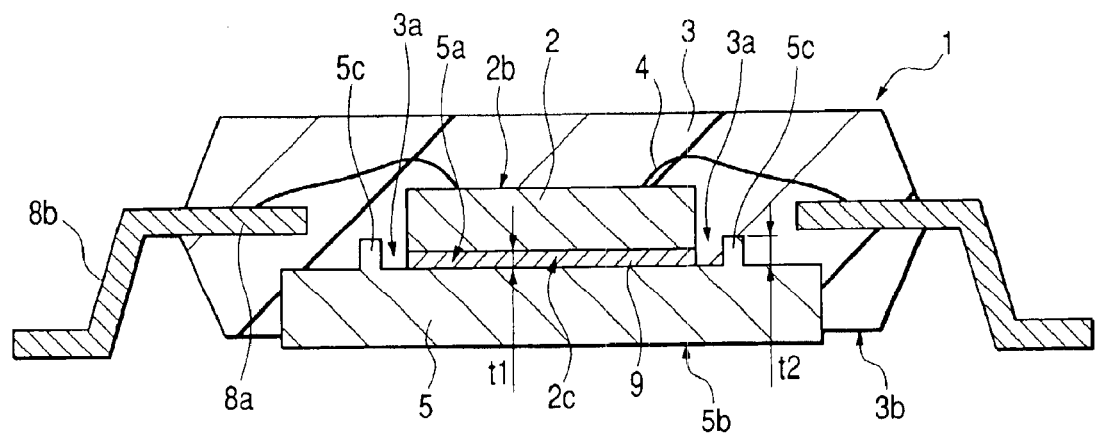
FIG. 5 is a sectional view showing a modified structure of the semiconductor device of the first embodiment.
Figure 6:
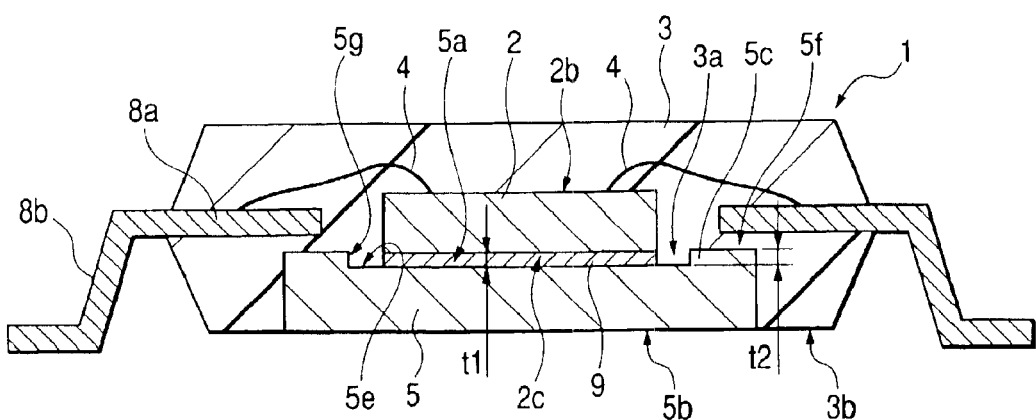
FIG. 6 is a sectional view showing a modified structure of the semiconductor device of the first embodiment.
Figure 7:
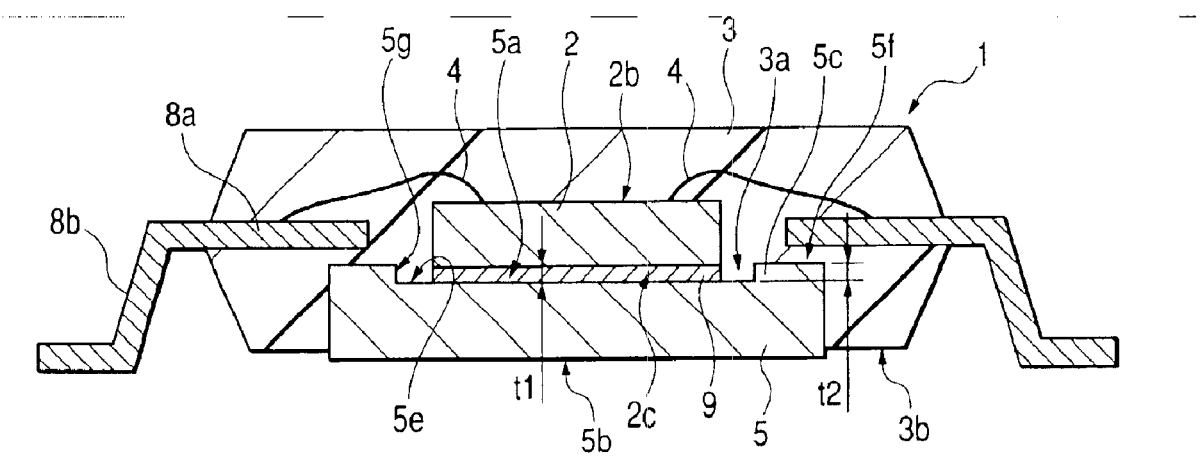
FIG. 7 is a sectional view showing a modified structure of the semiconductor device of the first embodiment.
Figure 8:
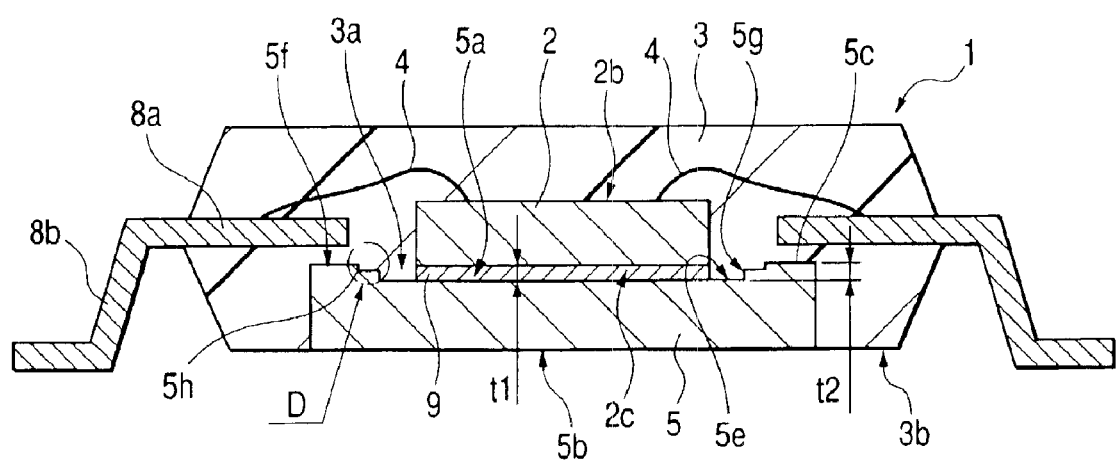
FIG. 8 is a sectional view showing a modified structure of the semiconductor device of the first embodiment.
Figure 9:
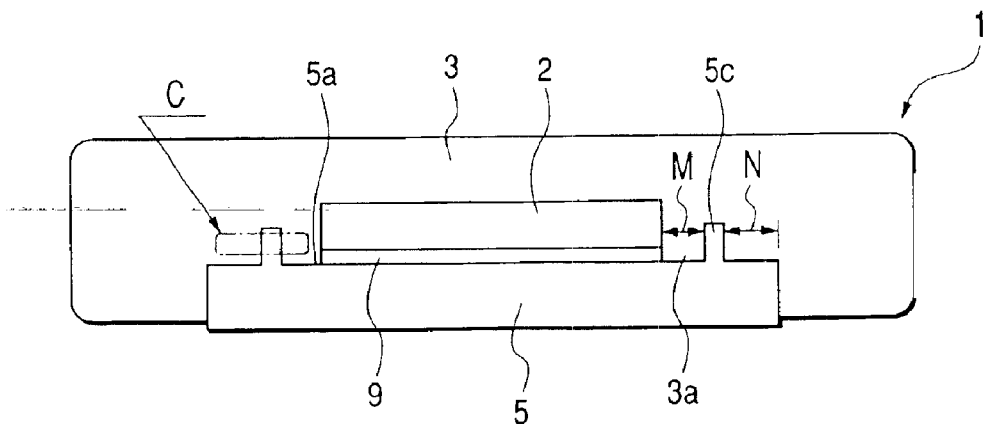
FIG. 9 is a conceptual diagram showing an example of a decreased state of resin shrinking power in the semiconductor device illustrated in FIG. 5.
Figure 10:
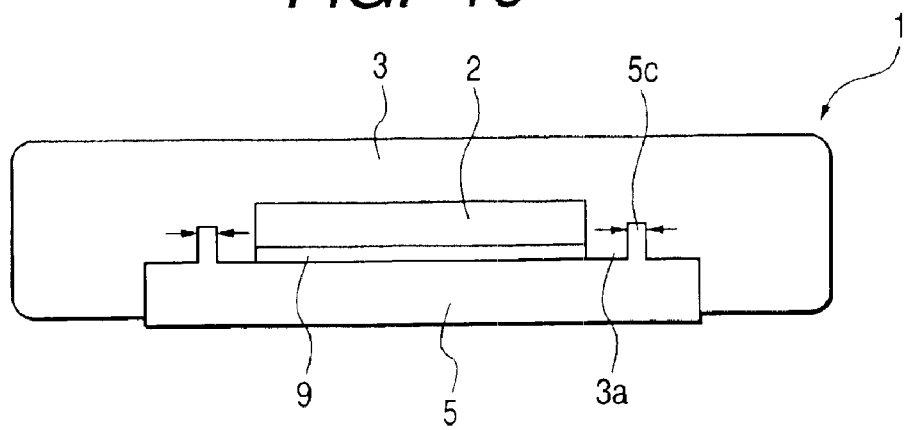
FIG. 10 is a conceptual diagram showing an example of a clamping force generated state for a protruding portion of a heat spreader with a thermal stress applied in the semiconductor device illustrated in FIG. 5.
Figure 11:
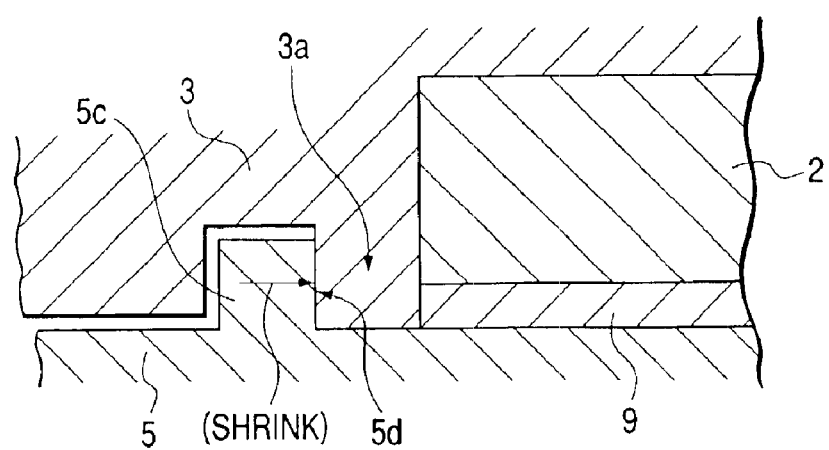
FIG. 11 is an enlarged partial sectional view showing a structural example of a protruding portion of a heat spreader and a chip side sealing portion with a thermal stress applied in the semiconductor device illustrated in FIG. 1.
Figure 12:
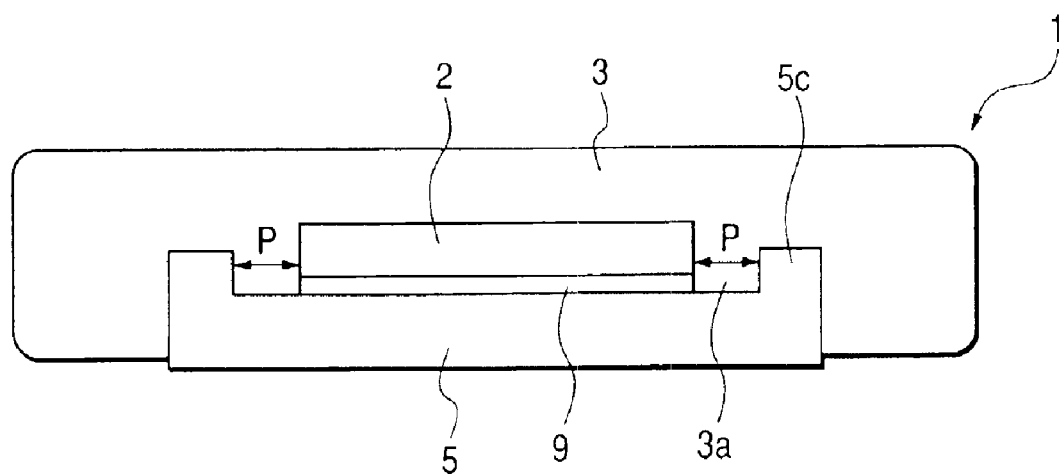
FIG. 12 is a conceptual diagram showing an example of a decreased state of resin shrinking power in the semiconductor device illustrated in FIG. 7.
Figure 13:
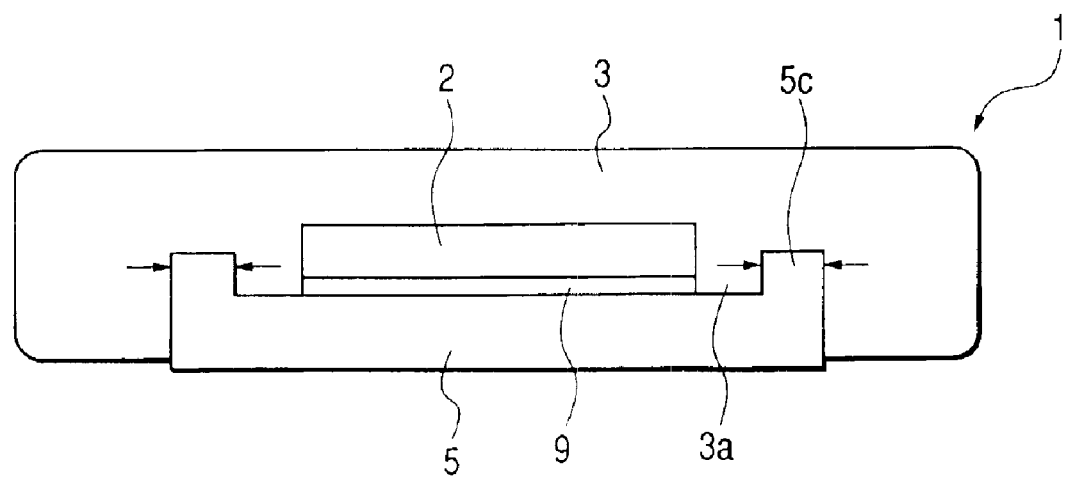
FIG. 13 is a conceptual diagram showing an example of a clamping force generated state for a protruding portion of a heat spreader with a thermal stress applied in the semiconductor device illustrated in FIG. 7.
Figure 14:
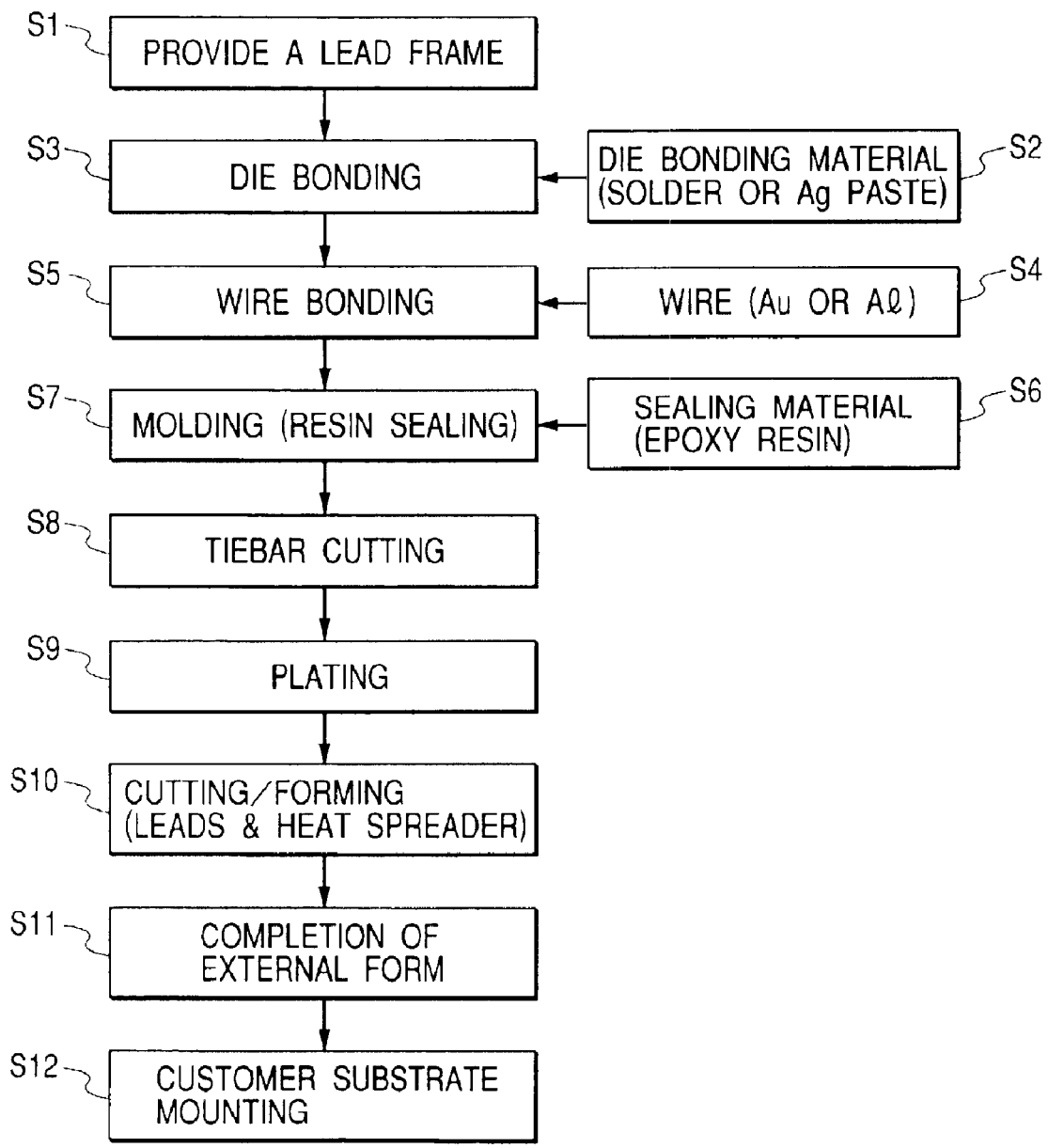
FIG. 14 is a manufacturing process flow chart showing an example of an assembling procedure for the semiconductor device of the first embodiment.
Figure 15:
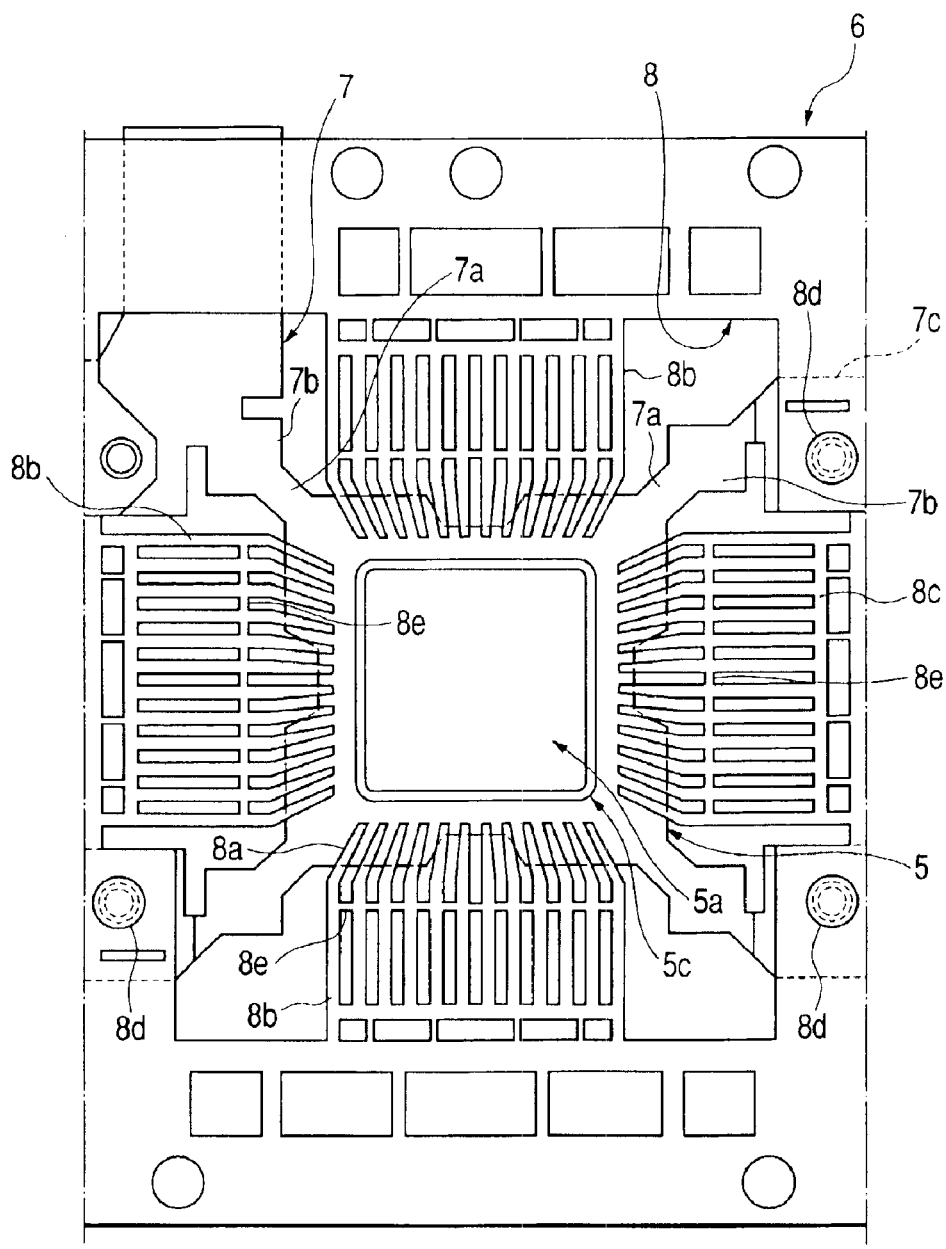
FIG. 15 is a partial plan view showing a structural example of a lead frame used in assembling the semiconductor device illustrated in FIG. 1.
Figure 16:
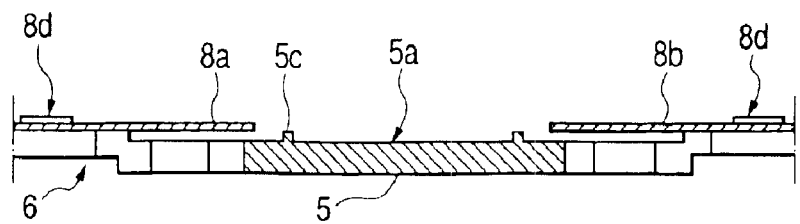
FIG. 16 is a sectional view showing the structure of the lead frame illustrated in FIG. 15.
Figure 17:
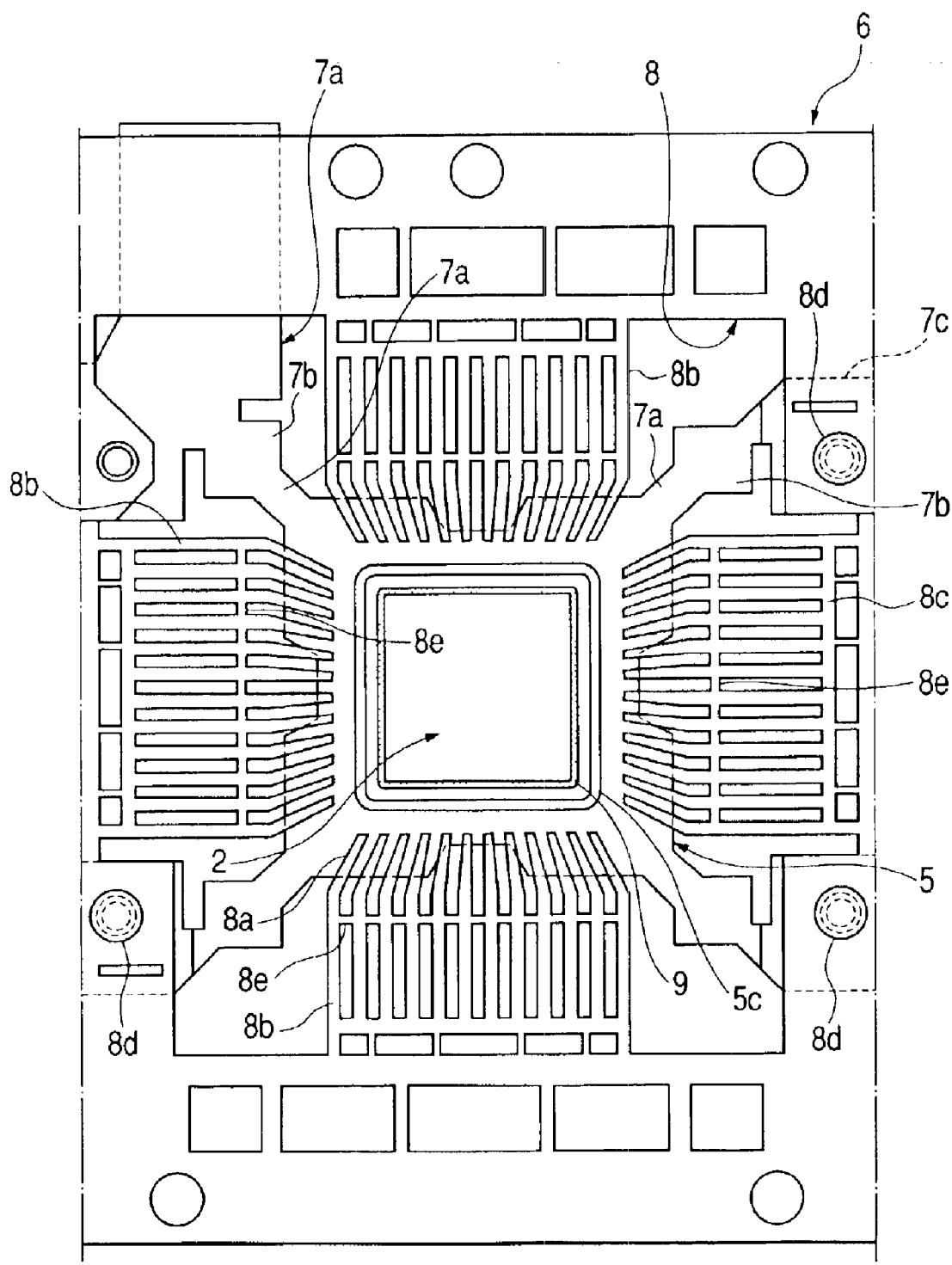
FIG. 17 is a partial plan view showing an example of a die bonding state in assembling the semiconductor device illustrated in FIG. 1.
Figure 18:
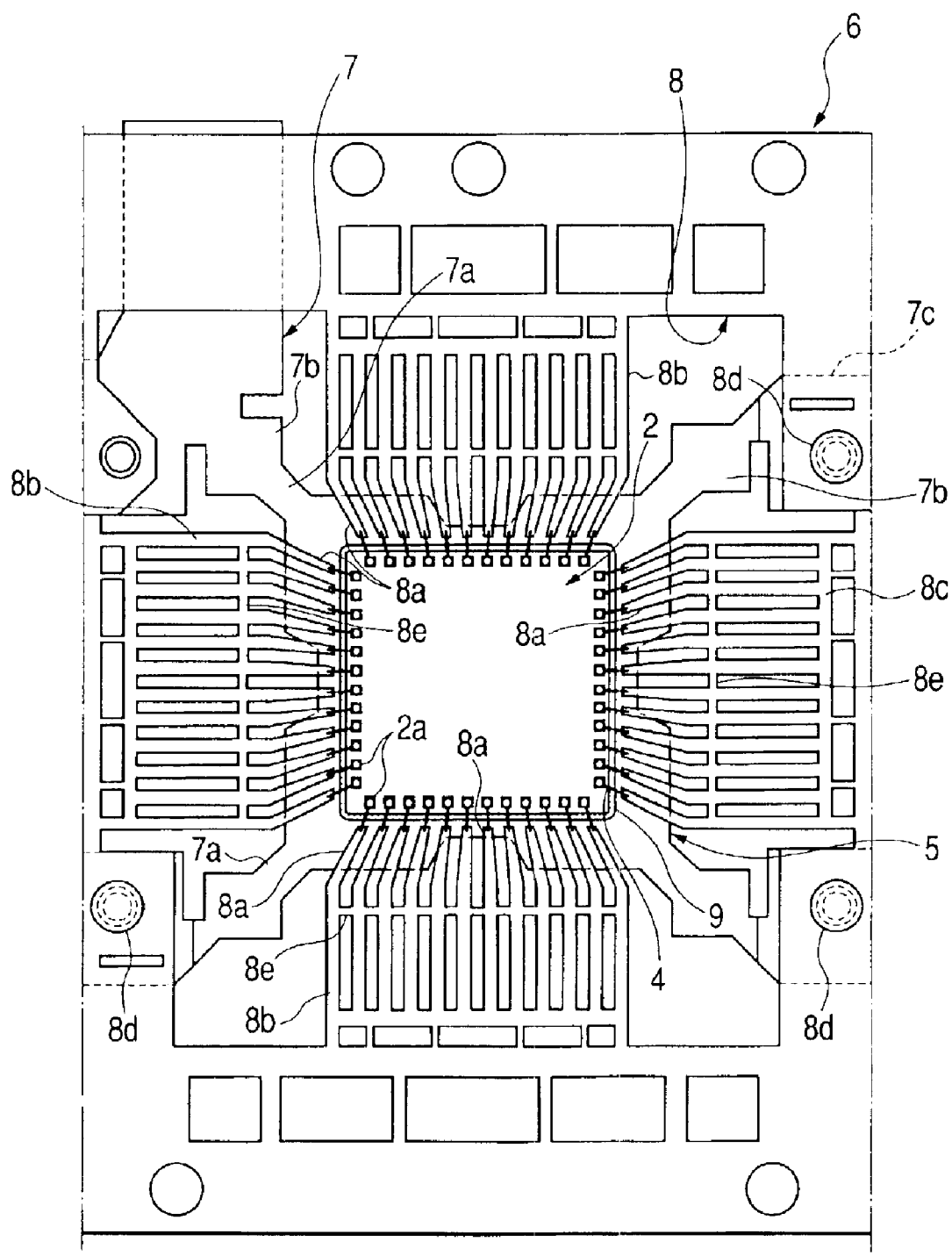
FIG. 18 is a partial plan view showing an example of a wire bonding state in assembling the semiconductor device illustrated in FIG. 1.
Figure 19:
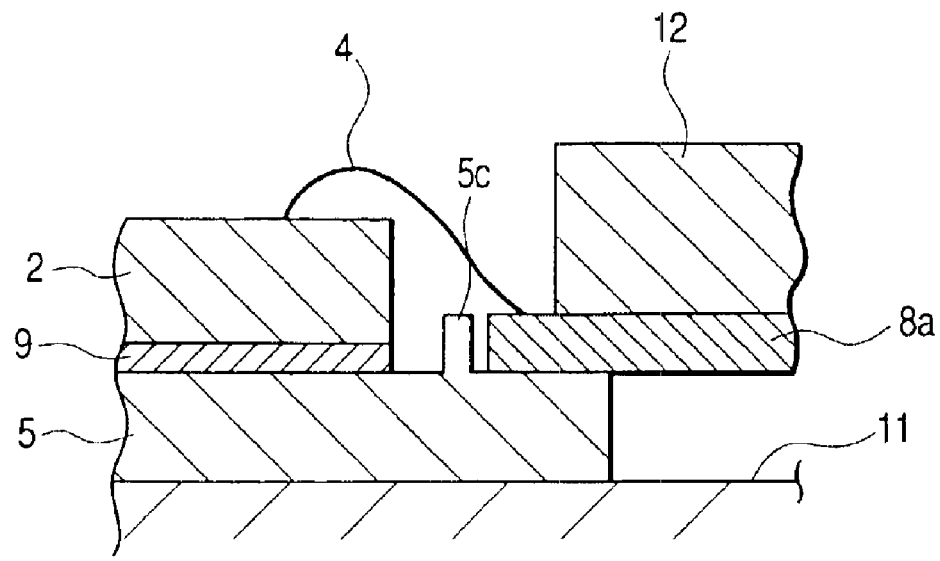
FIG. 19 is an enlarged partial sectional view showing an example of a wire bonding state in assembling the semiconductor device illustrated in FIG. 1.
Figure 20:
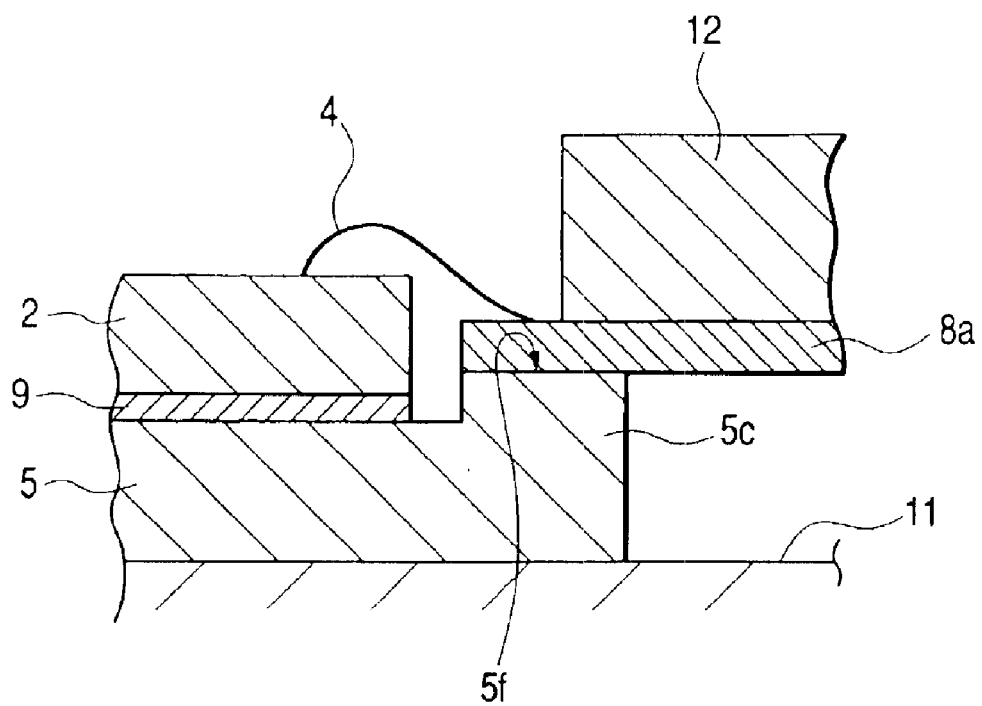
FIG. 20 is an enlarged partial sectional view showing a wire bonding state in assembling the modified semiconductor device illustrated in FIG. 6.
Figure 21:
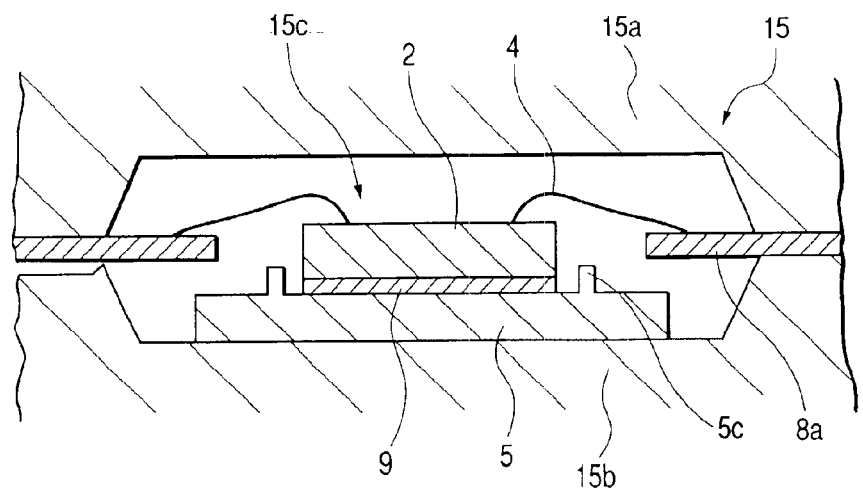
FIG. 21 is a partial sectional view showing an example of a molding state in assembling the semiconductor device illustrated in FIG. 1.
Figure 22:
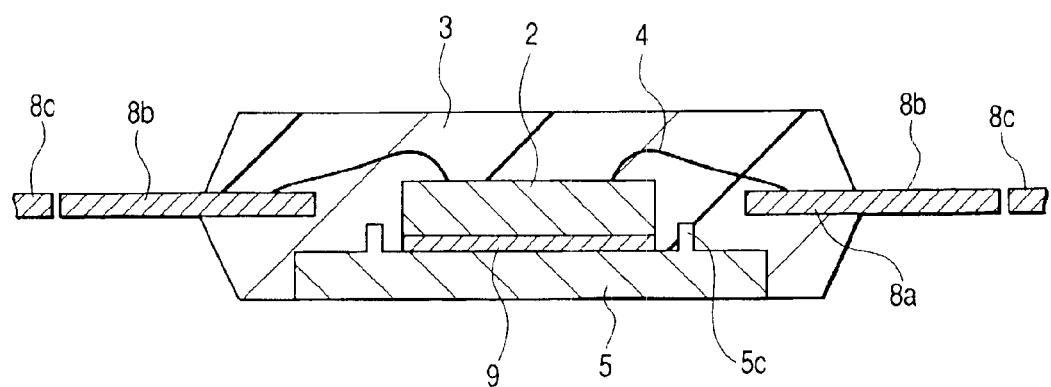
FIG. 22 is a partial sectional view showing an example of a cutting/forming state in assembling the semiconductor device illustrated in FIG. 1.
Figure 23:
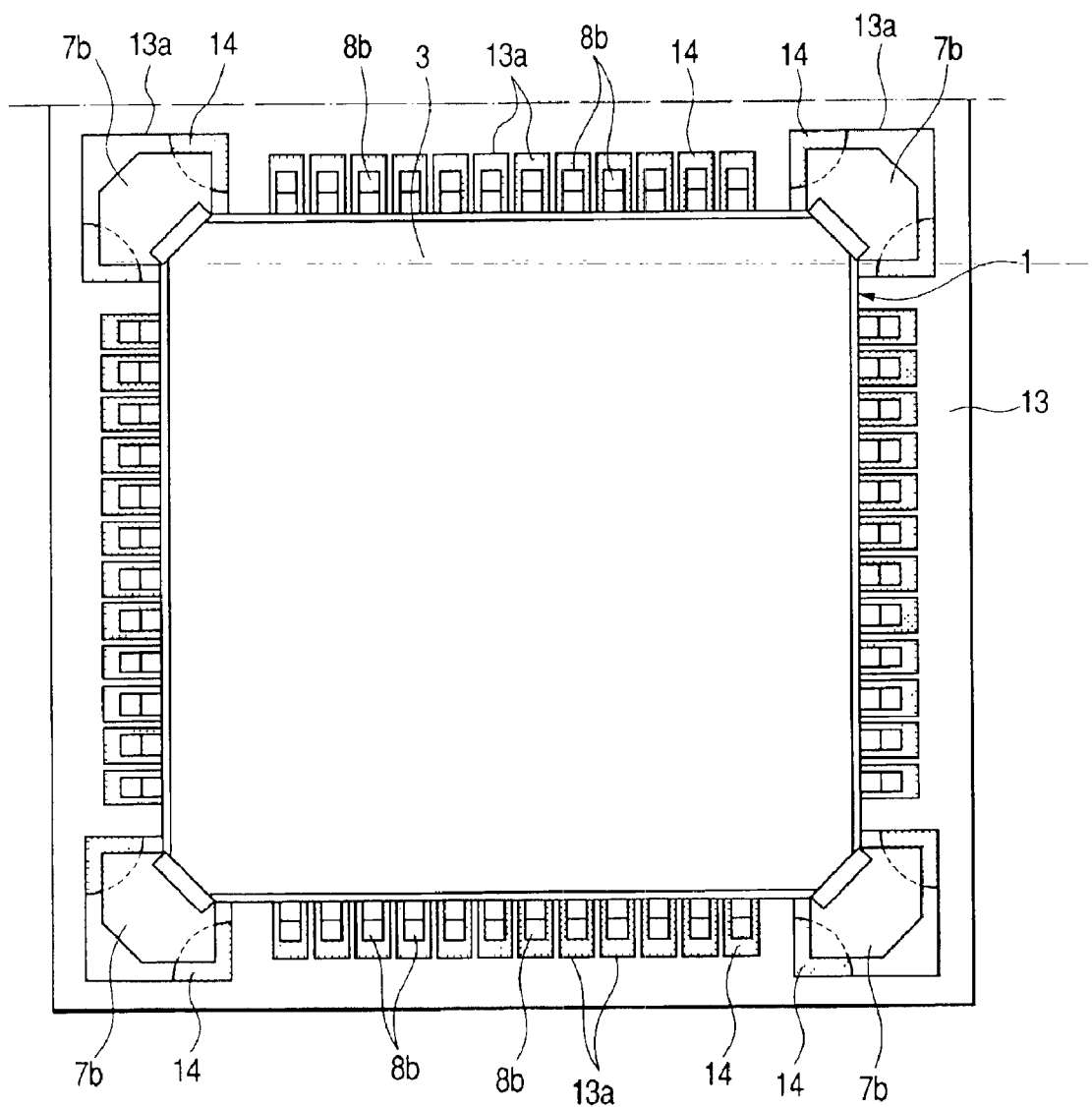
FIG. 23 is a partial plan view showing a structural example of the semiconductor device illustrated in FIG. 1 in a mounted state thereof onto a mounting substrate.
Figure 24:
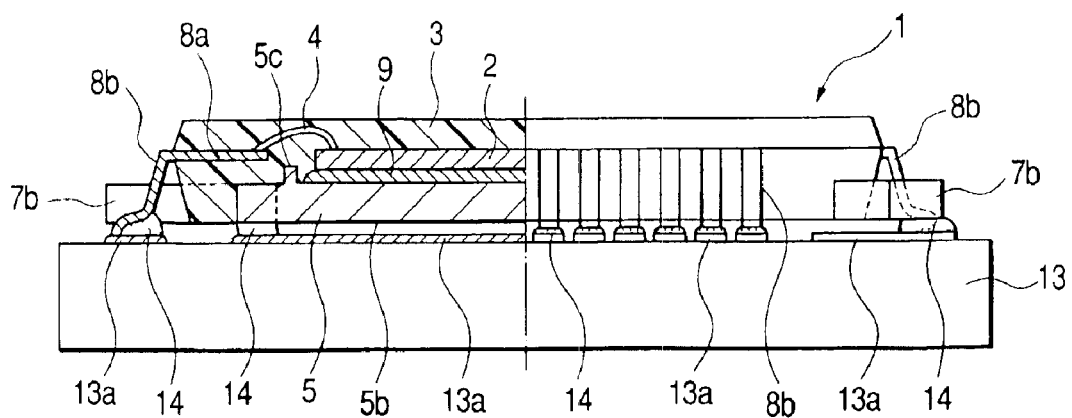
FIG. 24 is a partially cut-away side view showing the structure of the semiconductor device in the mounted state illustrated in FIG. 23.

FIG. 1 is a partially cut-away plan view showing a structural example of a semiconductor device according to a first embodiment of the present invention, FIG. 2 is a partially cut-away side view showing the structure of the semiconductor device illustrated in FIG. 1, FIG. 3 is a sectional view showing the structure in a diagonal direction of the semiconductor device illustrated in FIG. 1, FIG. 4 is a sectional view showing the structure of the semiconductor device illustrated in FIG. 1, FIGS. 5, 6, 7, and 8 are sectional views showing respectively modified structures of the semiconductor device of the first embodiment, FIG. 9 is a conceptual diagram showing an example of a decreased state of shrinking power in the semiconductor device illustrated in FIG. 5, FIG. 10 is a conceptual diagram showing an example of a clamping force generated state for a protruding portion of a heat spreader with a thermal stress applied in the semiconductor device illustrated in FIG. 5, FIG. 11 is an enlarged partial sectional view showing a structural example of a protruding portion of a heat spreader and a chip side sealing portion with a thermal stress applied in the semiconductor device illustrated in FIG. 1, FIG. 12 is a conceptual diagram showing an example of a decreased state of resin shrinking power in the semiconductor device illustrated in FIG. 7, FIG. 13 is a conceptual diagram showing an example of a clamping force generated state for a protruding portion of a heat spreader with a thermal stress applied in the semiconductor device illustrated in FIG. 7, FIG. 14 is a manufacturing process flow chart showing an example of an assembling procedure for the semiconductor device of the first embodiment, FIG. 15 is a partial plan view showing a structural example of a lead frame used in assembling the semiconductor device illustrated in FIG. 1, FIG. 16 is a sectional view showing the structure of the lead frame illustrated in FIG. 15, FIG. 17 is a partial plan view showing an example of a die bonding state in assembling the semiconductor device illustrated in FIG. 1, FIG. 18 is a partial plan view showing an example of a wire bonding state in assembling the semiconductor device illustrated in FIG. 1, FIG. 19 is an enlarged partial sectional view showing an example of a wire bonding state in assembling the semiconductor device illustrated in FIG. 1, FIG. 20 is an enlarged partial sectional view showing a wire bonding state in assembling the modified semiconductor device illustrated in FIG. 6, FIG. 21 is a partial sectional view showing an example of a molding state in assembling the semiconductor device illustrated in FIG. 1, FIG. 22 is a partial sectional view showing an example of a cutting/forming state in assembling the semiconductor device illustrated in FIG. 1, FIG. 23 is a partial plan view showing a structural example of the semiconductor device illustrated in FIG. 1 in a mounted state thereof onto a mounting substrate, and FIG. 24 is a partially cut-away side view showing the structure of the semiconductor device illustrated in FIG. 23.

The semiconductor device of this first embodiment is a surface-mounted semiconductor package of a resin sealed and wire bonding type, which is a high heat radiation type IC package able to realize a low thermal resistance.

Therefore, the semiconductor device has a semiconductor chip (also called a semiconductor pellet) 2 with a semiconductor integrated circuit formed on a main surface 2b thereof and is provided with a heat spreader 5 as a heat sink for radiating the heat generated from the semiconductor chip 2 to the exterior. For enhancing the heat radiating performance, a part of the heat spreader 5 is exposed from a resin body 3.

The heat spreader 5 also serves as a chip mounting portion and the semiconductor chip 2 is fixed onto the heat spreader through a chip bonding material 9.

As shown in FIG. 1, plural outer leads 8b project in four directions from the resin body 3 and are each bent in a gull wing shape. As an example of the semiconductor device in question, reference will here be made to a high heat radiation type QFP (Quad Flat Package) 1.

A detailed construction of the QFP 1 will now be described with reference to FIGS. 1 to 4. The QFP 1 comprises a semiconductor chip 2 having a main surface 2b and a rear surface 2c located on the side opposite to the main surface 2b, with a semiconductor device and plural bonding pads 2a as surface electrodes being formed on the main surface 2b, plural inner leads 8a arranged around the semiconductor chip 2, plural bonding wires 4 as connecting members for connecting the plural bonding pads 2a and the plural inner leads 8a electrically with each other, a heat spreader 5 as a chip mounting portion, the heat spreader 5 having a chip supporting surface 5a for supporting the semiconductor chip 2 and a rear surface 5b located on the side opposite to the chip supporting surface 5a and exposed to the exterior, a chip bonding material 9 disposed between the chip supporting surface 5a and the rear surface of the 2c of the semiconductor chip 2 to bond the semiconductor chip and the heat spreader 5 with each other, a resin body 3 which seals the semiconductor chip 2, plural inner leads 8a and plural bonding wires 4 with a sealing resin, the resin body 3 having a chip side sealing portion 3a disposed sideways of the semiconductor chip 2, and plural outer leads 8b formed integrally with the plural inner leads 8a respectively and projecting to the exterior from the resin body 3. Further, such a protruding portion 5c as shown in FIGS. 2 and 4, which projects above the chip supporting surface 5a, is formed around the chip on the chip supporting surface 5a of the heat spreader 5.

Since the QFP 1 is of a high heat radiation type, when the heat spreader 5 as a heat radiating member supports the semiconductor chip 2 directly and the rear surface 5b of the heat spreader 5 is exposed to a rear surface 3b of the resin body, the heat generated from the semiconductor chip 2 is transmitted directly to the heat spreader 5 through the chip bonding material 9 and is released to the exterior of the package or is transmitted to a mounting substrate 13 (see FIG. 23) from the rear surface 5b of the heat spreader 5.

In the QFP 1 shown in FIG. 4, the rear surface 5b of the heat spreader 5 and the rear surface 3b of the resin body 3 are flush with each other.

At corner portions of the heat spreader 5 are provided heat sinks called bumpers 7b through suspension leads 7a, as shown in FIGS. 1 and 3. The bumpers 7b are disposed in an exposed state to four corners of the resin body 3 to further enhance the heat radiating effect, as shown in FIG. 1.

Therefore, it is preferable that the heat spreader 5 be formed using, for example, a metallic material having a high thermal conductivity such as copper, copper alloy, or aluminum.

In the QFP 1 of this embodiment, such a protruding portion 5c as shown in FIGS. 2 and 4 is formed around the chip on the chip supporting surface 5a of the heat spreader 5 so as to project above the chip supporting surface.

For example, the protruding portion 5c is formed in the shape of a frame around the semiconductor chip 2, as shown in FIG. 17.

The following description is now provided about the protruding portion 5c formed around the semiconductor chip 2.

Figure 28:
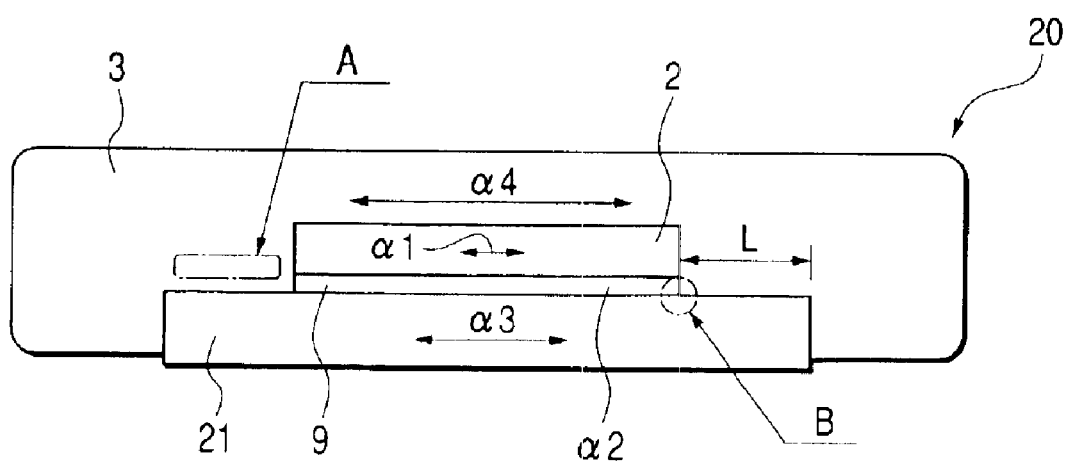
FIG. 28 is a conceptual diagram showing a difference in thermal expansion coefficient among components used in a comparative high radiation type semiconductor device.

First, in a comparative high heat radiation type semiconductor device 20 having such a heat spreader 21 as shown in FIG. 28 not provided with the protruding portion 5c, its components and thermal expansion coefficients thereof are as follows. A semiconductor chip 2 is made of silicon and a thermal expansion coefficient thereof α1 is 3 ppm/k, a chip bonding material 9 is silver paste and a thermal expansion coefficient thereof α2 is 28 ppm/k, the heat spreader 21 is made of copper and a thermal expansion coefficient thereof α3 is 18 ppm/k, and a resin body 3 is an epoxy-based thermosetting resin and a thermal expansion coefficient thereof α4 is 25 ppm/k.

Therefore, when the high heat radiation type semiconductor device 20 is subjected to reflow or a temperature cycle test, there occurs a thermal stress due to the difference in thermal expansion coefficient between the resin body 3 and the heat spreader 21, so that the resin body 3 (sealing resin) and the semiconductor chip 2, as well as the resin body 3 (sealing resin) and the heat spreader 21, undergo a convex deformation toward a bottom of the high radiation type semiconductor device 20, while the semiconductor chip 2 and the heat spreader 21 undergo a convex deformation toward an upper surface of the semiconductor device 20.

As a result, the bonded portion between the heat spreader 21 and the resin body 3 peels off, whereupon a portion "A" shown in FIG. 28, i.e., a horizontal portion with respect to the semiconductor chip 2 located around the chip on the heat spreader 21 comes to be constituted by a single member of only the chip side sealing portion 3a of the sealing resin. Therefore, a thermal stress is directly concentrated on a portion "B" shown in FIG. 28, i.e., an end portion of a chip bonding material (chip bonded portion) 9, with consequent deterioration of the chip bonded portion.

In the high heat radiation type semiconductor device 20, the chip bonding material 9 plays an important role not only in fixing the semiconductor chip 2 but also in enhancing the heat radiating performance from the semiconductor chip. Deterioration of the chip bonding material 9 leads to deterioration of the heat radiating performance and also deterioration of the package reliability.

On the other hand, in the QFP 1 of this first embodiment illustrated in FIGS. 1 to 4, since the protruding portion 5c protruding above the chip supporting surface 5a is formed around the chip on the chip supporting surface 5a of the heat spreader 5, a portion "C" shown in FIG. 9, i.e., a horizontal portion with respect to the semiconductor chip 2 located around the chip on the chip supporting surface 5a of the heat spreader 5 is constituted by both chip side sealing portion 3a of the sealing resin and protruding portion 5c of the heat spreader 5, as shown in FIG. 4. Consequently, the length M shown in FIG. 9 and the length L shown in FIG. 28 are in a relation of M<<L and thus the amount of sealing resin in the chip side sealing portion 3a is much smaller than in the high heat radiation type semiconductor device 20.

As a result, in the QFP 1, it is possible to diminish the difference in thermal stress caused by the difference in thermal expansion coefficient between the sealing resin and the heat spreader 5 at the side portion of the chip, whereby the stress imposed on an end portion of the chip bonding material 9 can be relieved.

Further, in QFP 1, as shown in FIG. 10, a clamping force for the protruding portion 5c of the heat spreader 5 is developed by shrinkage of the sealing resin at the side portion of the chip, whereby there is created an effect of suppressing an opening deformation of the interface between the sealing resin and the chip supporting surface 5a of the heat spreader 5. That is, the stress induced by shrinkage of the sealing resin at the side portion of the chip is received by the protruding portion 5c and is relieved thereby.

Therefore, even if the protruding portion 5c of the heat spreader 5 and the sealing resin peel off each other in the vicinity of the protruding portion 5c, the aforesaid stress is received by the protruding portion 5c, thus making it possible to relieve the stress imposed on an end portion of the chip bonding material 9 (chip bonded portion).

For example, as shown in FIG. 11, even if the resin body 3 (sealing resin) and the protruding portion 5c peel off each other due to their shrinkage, forming a gap between an outside portion of the protruding portion 5c and the sealing resin located outside, a stress developed in the chip side sealing portion 3a can be received by an inner wall surface 5d of the protruding portion 5c because the inner wall surface 5d and the chip side sealing portion 3a come into contact with each other due to shrinkage of the protruding portion 5c. Consequently, it is possible to relieve the stress imposed on the end portion of the chip bonding material 9 (chip bonded portion).

Thus in the QFP 1 of this first embodiment, since the protruding portion 5c protruding above the chip supporting surface 5a of the heat spreader 5 is formed around the chip, it is possible to relieve the stress imposed on the end portion of the chip bonding material (chip bonded portion) and hence possible to prevent deterioration of the chip bonding material 9.

As a result, the heat generated from the semiconductor chip 2 can be transmitted positively to the heat spreader 5 through the chip bonding material 9 and therefore it is possible to ensure a high heat radiating performance required for the high radiation type QFP 1. Accordingly, it is possible to improve the reliability of the QFP 1.

In the QFP 1, it is preferable that the distance M shown in FIG. 9, i.e., the width of the chip side sealing portion 3a be as small as possible so as to decrease the amount of the sealing resin in the chip side sealing portion.

It is therefore preferable that the protruding portion 5c be formed at a position as close as possible to the semiconductor chip 2. However, there must be formed a gap which permits the sealing resin to get in between the semiconductor chip 2 and the protruding portion 5c along the side portion of the chip at the time of molding.

That is, it is preferable that the protruding portion 5c in the QFP 1 be formed at a position which permits the formation of a minimum gap allowing the sealing resin to get in between the semiconductor chip 2 and the protruding portion 5c at the time of molding, and as close as possible to the semiconductor chip 2. In other words, it is preferable that the distance M shown in FIG. 9 be as small as possible insofar as it permits the formation of the chip side sealing portion 3a in the outer peripheral direction of the heat spreader 5.

Accordingly, as to the position of the protruding portion 5c on the chip supporting surface 5a of the heat spreader 5, as shown in FIG. 9, it is preferable that the distance (M) of the protruding portion 5c from an end portion of the semiconductor chip 2 be shorter than the distance from the protruding portion 5c to an end portion (N) of the heat spreader 5. By setting M<N, the amount of the sealing resin in the chip side sealing portion 3a can be decreased to a satisfactory extent, with the result that the stress imposed on the end portion of the chip bonding material 9 can be fully relieved. Consequently, it is possible to prevent deterioration of the chip bonding material 9 and improve the reliability of the QFP 1.

For positively relieving the stress imposed on the end portion of the chip bonding material 9, the height of the protruding portion 5c of the heat spreader 5 is set as high as possible from the chip supporting surface 5a. This is because the larger the height of the protruding portion 5c, the greater the extent of relieving the stress imposed on the end portion of the chip bonding material 9. Preferably, as shown in FIG. 4, the height of the protruding portion 5c of the heat spreader 5 from the chip supporting surface 5a is set larger than the thickness of the chip bonding material 9. For example, if the thickness (t1) of the chip bonding material 9 is 50 $\mu$m, the height (t2) of the protruding portion 5c is set at 100 $\mu$m or so. As a result, it is possible to surely relieve the stress imposed on the the end portion of the chip bonding material 9 and improve the reliability of the QFP 1.

Next, the method of manufacturing the QFP 1 according to the present invention will be described below in accordance with the manufacturing process flow chart shown in FIG. 14.

First, as shown in FIGS. 15 and 16, there is provided a multi-lead frame 6, the multi-lead frame 6 comprising a multi-heat sink 7 and a multi-frame 8 bonded together, the multi-heat sink having plural heat spreaders 5, the heat spreaders 5 each having chip supporting surface 5a and a frame-shaped protruding portion 5c protruding upward from the chip supporting surface 5a, the multi-frame 8 having inner leads 8a and outer leads 8b, (step S1 in FIG. 14).

In package areas of the multi-heat sink 7 are respectively formed heat spreaders 5 as chip mounting portions, and a protruding portion 5c is formed in a frame shape on each chip supporting surface 5a.

Each heat spreader 5 is supported by suspension leads 7a at corner portions thereof. Further, each suspension lead 7a is integrally connected to a corner end portion 7c.

On the other hand, the multi-frame 8 is provided with plural inner leads 8a and plural outer leads 8b connected integrally to the inner leads. Adjacent leads are connected together through a tiebar 8e and each outer lead 8b is supported at its outer end by a support portion 8c.

As shown in FIG. 15, the multi-frame 8 and the multi-heat sink 7 are connected together at connections 8d by caulking, whereby the multi-lead frame 6 is formed.

At this time, in the multi-heat sink 7, a bending work is performed in the vicinity of the suspension leads 7a so that each heat spreader 5 becomes lower than the corner end portions 7c. Therefore, after the multi-heat sink 7 and the multi-frame 8 have been caulked together at the connections 8d, there is formed such a gap as shown in FIG. 16 between each inner lead 8a and each heat spreader 5.

Thereafter, a chip bonding material 9 is applied to the chip supporting surface 5a of each heat spreader 5 and a semiconductor chip 2 is disposed on the chip bonding material 9, followed by die bonding as in step S3.

In this case, first as shown in step S2, the chip bonding material 9 as a die bonding material such as solder or silver paste is fed onto the chip supporting surface 5a of the heat spreader 5. Further, as shown in FIG. 17, the semiconductor chip 2 is disposed inside the frame-shaped protruding portion 5c on the chip supporting surface 5a of the heat spreader 5 and a rear surface 2c of the semiconductor chip 2 and the chip supporting surface 5a of the heat spreader 5 are bonded together through the chip bonding material 9.

Thereafter, wires such as gold or aluminum wires are fed as in step S4 and wire bonding is performed as in step S5.

In this case, as shown in FIG. 19, first the heat spreader 5 is disposed on a bonding stage 11 and thereafter inner leads 8a are arranged outside the protruding portion 5c of the heat spreader 5.

More specifically, inner leads 8a are arranged on the heat spreader 5 in such a manner that the protruding portion 5c is positioned between the semiconductor chip 2 and the inner leads 8a, then in this positional relation the heat spreader 5 and the inner leads 8a are brought into contact with each other and are clamped together using a clamp member 12 which is for bonding.

Further, in this clamped state, heat is transmitted from the bonding stage 11 to the inner leads 8a through the heat spreader 5, and as shown in FIG. 18, bonding pads 2a on the semiconductor chip 2 and corresponding inner leads 8a are connected together electrically through bonding wires 4.

Subsequently, the clamped state by the clamp member 12 is released and the heat spreader 5 and the inner leads 8a are disengaged from each other by spring-back. More specifically, the inner leads 8a are disengaged from the heat spreader 5 by spring-back of the inner leads.

Thereafter, a sealing material (sealing resin) such as an epoxy-based thermosetting resin is fed as in step S6 and molding is performed as in step S7.

To be more specific, as shown in FIG. 21, a cavity 15c is formed by an upper die 15a and a lower die 15b of a molding die 15 and the heat spreader 5 with the semiconductor chip 2 mounted thereon is placed within the cavity 15c, then the sealing resin is fed into the cavity 15c and the semiconductor chip 2 and the bonding wires 4 are sealed with the resin by molding.

At this time, a resin body 3 is formed in such a manner that a rear surface 5b as the side opposite to the chip supporting surface 5a of the heat spreader 5 is exposed to a rear surface 3b of the resin body 3.

Further, the sealing resin is allowed to flow curvedly between the side portion of the semiconductor chip 2 and the protruding portion 5c to form the resin body 3 having a chip side sealing portion 3a.

Thereafter, tiebar cutting is performed as in step S8. More specifically, the tiebars 8e shown in FIG. 15 are cut to isolate the outer leads 8b from one another.

Then, external plating is performed for the outer leads 8b as in step S9.

Subsequently, cutting/forming is performed as in step S10. As shown in FIG. 22, the plural outer leads 8b projecting from the resin body 3 are cut off from the support portions 8c of the multi-frame 8 in the lead frame 6 and are bent in a gull wing shape as in FIG. 4, whereby an external form is completed as in step S11.

Thereafter, the QFP 1 thus completed is shipped and a customer substrate mounting is performed on the customer side as in step S12. That is, as shown in FIG. 23, the QFP 1 is mounted on a mounting substrate 13 through solder 14. In this case, the QFP 1 is mounted so that the outer leads 8b are connected through the solder 14 to lands 13a of the mounting substrate 13.

Since the QFP 1 of this first embodiment is of a high heat radiation type, the rear surface 5b of the heat spreader 5 is exposed to the rear surface 3b of the resin body 3, so that when mounting the QFP onto the mounting substrate, the rear surface 5b of the heat spreader 5 and the lands 13a of the mounting substrate 13 are connected together through the solder 14. In this case, it is optional whether the solder 14 is to be connected to a part, for example, peripheral edge portion, of the rear surface 5b of the heat spreader 5 or is to be connected throughout the whole of the rear surface 5b.

Next, a description will be given below about modified QFPs 1 of the first embodiment, which are illustrated in FIGS. 5 to 8.

A QFP 1 shown in FIG. 5 is similar to the QFP 1 shown in FIG. 4, but not only the rear surface 5b of the heat spreader 5 is exposed to the rear surface 3b of the resin body 3, but also the heat spreader 5 is slightly exposed from the rear surface 3b of the resin body 3 to increase the exposed area of the heat spreader 5, thereby further enhancing the heat radiating performance of the QFP 1.

As to the method of manufacturing the QFP 1 shown in FIG. 5, it is the same as that for the QFP 1 shown in FIG. 4.

A QFP 1 shown in FIG. 6 is similar to the QFP 1 shown in FIG. 4, but the protruding portion 5c of the heat spreader 5 is formed from an outside of the chip side sealing portion 3a up to an end portion of the heat spreader 5.

In the QFP 1 shown in FIG. 6, when seen from a different angle, a square recess 5e is formed in an upper surface 5f of the heat spreader 5, and in this portion recessed from the upper surface 5f there is formed a square chip supporting surface 5a. Further, a wall portion 5g which surrounds the semiconductor chip 2 is formed on the chip supporting surface 5a. Thus, the semiconductor chip 2 is fixed to the recess 5e.

In the QFP 1 shown in FIG. 6, the portion corresponding to the protruding portion 5c is formed from the outside of the chip side sealing portion 3a up to an end portion of the heat spreader 5, so that a stress induced by deformation of the sealing resin in the vicinity of the protruding portion 5c of the heat spreader is received by the protruding portion 5c which is wide. Consequently, the stress can be relieved and hence it is possible to relieve the stress imposed on an end portion of the chip bonding material (chip bonded portion).

Thus, also in the QFP 1 shown in FIG. 6, the length P shown in FIG. 12 and the length L shown in FIG. 28 are in the relation of P<<L. Therefore, the amount of sealing resin in the chip side sealing portion 3a is much smaller than in the high radiation type semiconductor device 20 shown in FIG. 28.

As a result, also in the QFP 1 shown in FIG. 6, a difference in thermal stress caused by the difference in thermal expansion coefficient between the sealing resin at the side portion of the chip and the heat spreader 5 can be diminished and so it is possible to relieve the stress imposed on the end portion of the chip bonding material 9.

In the QFP 1 shown in FIG. 6, moreover, a force for clamping the protruding portion 5c of the heat spreader 5 can be generated by shrinkage of the chip side sealing resin, as shown in FIG. 13, so that the stress induced by shrinkage of the chip side sealing resin can be received and retrieved by the protruding portion 5c and hence it is possible to retrieve the stress imposed on the end portion of the chip bonding material 9.

Further, in the QFP 1 shown in FIG. 6, by setting the height (t2) of the wall portion 5g of the recess 5e from the chip supporting surface 5a larger than the thickness (t1) of the chip bonding material 9, a stress induced by deformation of the sealing resin in the vicinity of the wall portion 5g can be received by the wall portion 5g, so that the stress can be further relieved and therefore it is possible to further retrieve the stress imposed on the end portion of the chip bonding material 9.

The method of manufacturing the QFP 1 shown in FIG. 6 is almost the same as the manufacturing method for the QFP 1 shown in FIG. 4, but at the time of clamping the inner leads 8a and the heat spreader 5 by both bonding stage 11 and clamp member 12 in the wire bonding step, as shown in FIG. 20, first the heat spreader 5 is disposed on the bonding stage 11, thereafter the inner leads 8a are disposed on the protruding portion 5c of the heat spreader 5, i.e., on the upper surface 5f of the heat spreader 5, and the heat spreader 5 and the inner leads 8a are clamped with the clamp member 12 so that both are put in contact with each other.

Further, in this clamped state, heat is transmitted from the bonding stage 11 to the inner leads 8a through the heat spreader 5, and bonding pads 2a on the semiconductor chip 2 and the inner leads 8a are connected together electrically through bonding wires 4.

Thereafter, the clamped state by the clamp member 12 is released, allowing the heat spreader 5 and the inner leads 8a to become disengaged from each other, thereby completing the wire bonding step.

A QFP 1 shown in FIG. 7 is similar to the QFP 1 shown in FIG. 6, but not only the rear surface 5b of the heat spreader 5 is exposed to the rear surface 3b of the resin body 3, but also, as is the case with the QFP 1 shown in FIG. 5, the heat spreader 5 is slightly projected from the rear surface 3b of the resin body 3 to increase the exposed area of the heat spreader, thereby further enhancing the heat radiating performance of the QFP 1 shown in FIG. 7.

A QFP 1 is similar to the QFP 1 shown in FIG. 6, with the proviso that a cutout portion 5h is formed in an inside end portion (portion "D" in FIG. 8) of the upper surface 5f of the protruding portion 5c in the heat spreader 5.

Thus, in the QFP 1 shown in FIG. 8, the protruding portion 5c of the heat spreader 5 is formed in a stepped shape, two steps in FIG. 8. That is, the protruding portion 5c of the heat spreader 5 in the QFP 1 of the first embodiment may be formed in a stepped shape of two or more plural steps.

The method of manufacturing the QFPs 1 shown in FIGS. 7 and 8 is the same as that for the QFP 1 shown in FIG. 6.

Second Embodiment

Figure 25:
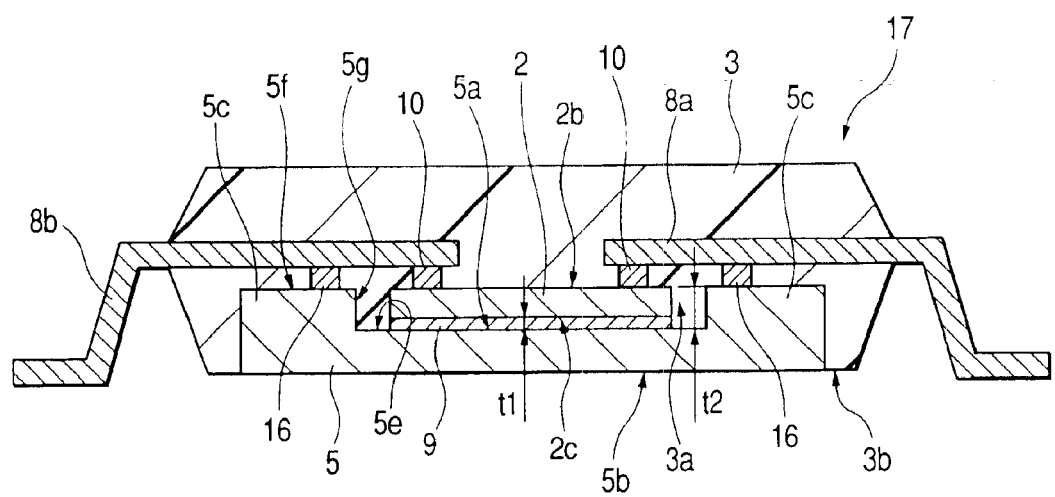
FIG. 25 is a sectional view showing a structural example of a semiconductor device according to a second embodiment of the present invention.
Figure 26:
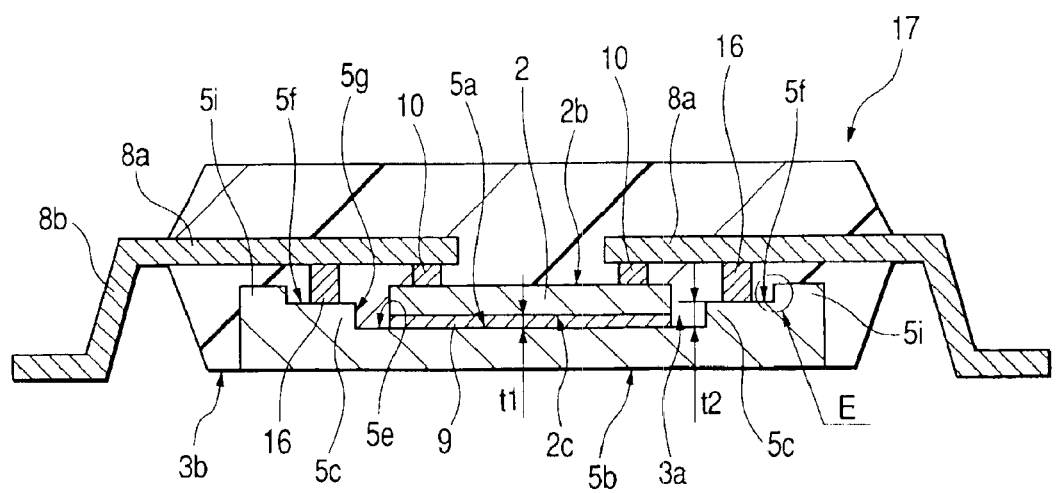
FIG. 26 is a sectional view showing a modified structure of the semiconductor device of the second embodiment.
Figure 27:
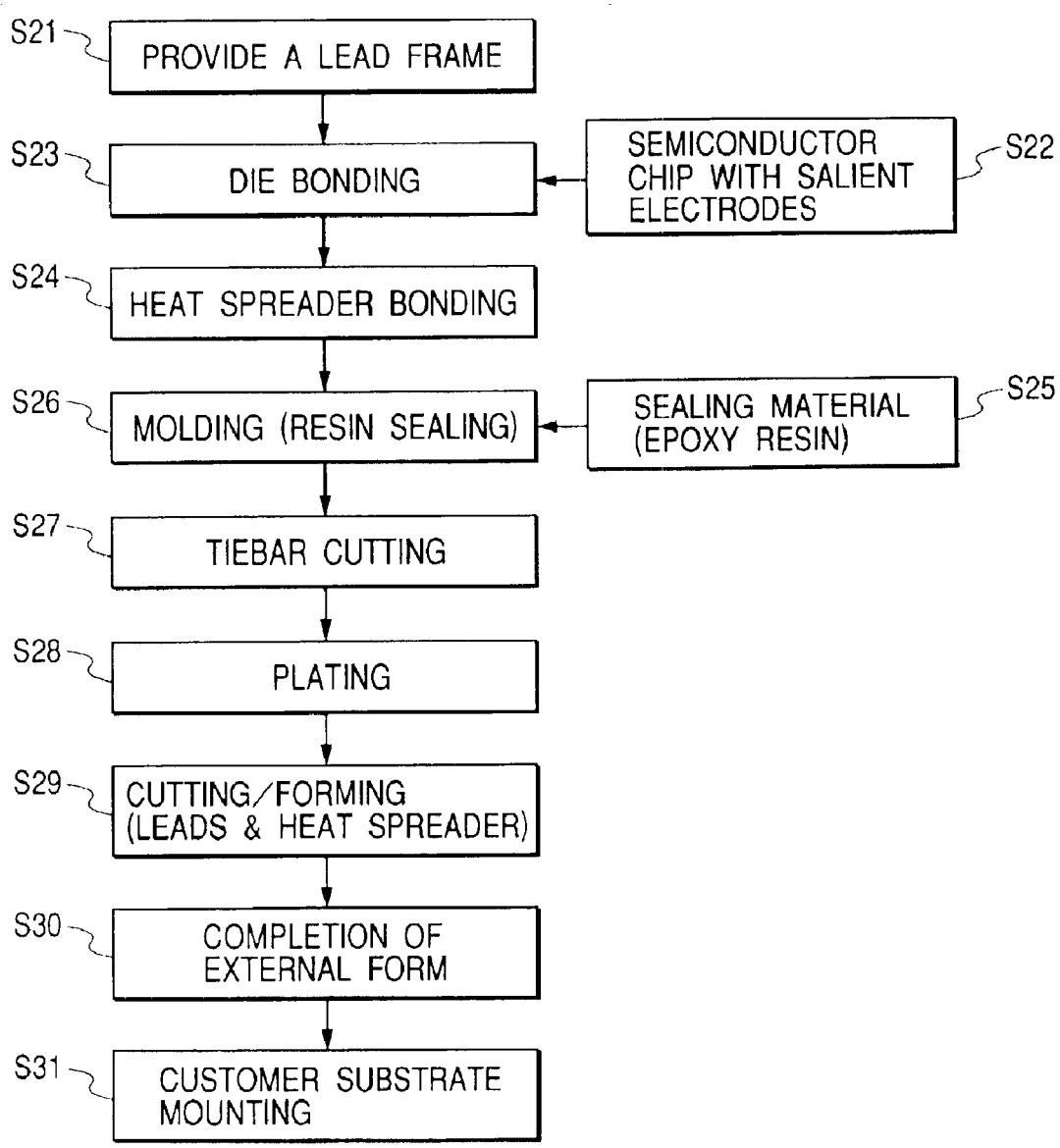
FIG. 27 is a manufacturing process flow chart showing an example of an assembling procedure for the semiconductor device of the second embodiment.

FIG. 25 is a sectional view showing a structural example of a semiconductor device according to a second embodiment of the present invention, FIG. 26 is a sectional view showing a modified structure of the semiconductor device of the second embodiment, and FIG. 27 is a manufacturing process flow chart showing an example of an assembling procedure for the semiconductor device of the second embodiment.

Like the QFP 1 of the first embodiment shown in FIG. 6, the semiconductor device (QFP 17) of this second embodiment is also a surface-mounted semiconductor package of a resin sealed type, which is a high radiation type IC package able to realize a low thermal resistance. A different point of the QFP 17 from the QFP 1 shown in FIG. 6 is that salient electrodes 10 such as gold bumps, not bonding wires 4, are used as connecting members for connecting the semiconductor chip 2 and the inner leads 8a with each other.

This is because the bonding wires 4 are small in diameter and presents a high ON resistance and therefore it is intended to lower the ON resistance by using salient electrodes 10 as wireless connectors and as a substitute for the bonding wires 4.

To this end, inside end portions of inner leads 8a are arranged on and in opposition to the main surface 2b of the semiconductor chip 2, bonding pads 2a (see FIG. 1) of the semiconductor chip 2 and inner leads 8a are electrically connected together by salient electrodes 10 such as gold bumps or solder bumps, and inner leads 8a for ground (GND) and the head spreader 5 are connected together by conductive members 16 such as gold bumps or solder bumps.

According to this construction, by disposing lands 13a for ground just under the spreader 5 in the QFP 17 and connecting the lands 13a with the heat spreader 5 electrically by solder 14 at the time of mounting the chip onto the mounting substrate 13 (see FIG. 24), it is possible to enhance the ground.

As to other structural points of the QFP 17 of this second embodiment, they are the same as in the QFP 1 of the first embodiment shown in FIG. 6, so repeated explanations thereof will here be omitted.

Next, how to manufacture the QFP 17 of this second embodiment will be described below in accordance with the manufacturing process flow chart shown in FIG. 27.

First, as is the case with the lead frame 6 shown in FIGS. 15 and 16, there is provided a multi-lead frame 6 comprising a multi-heat sink 7 and a multi-frame 8 bonded together, the multi-heat sink 7 having plural heat spreaders 5, the heat spreaders 5 each having a chip supporting surface 5a and a frame-shaped protruding portion 5c protruding upward from the chip supporting surface 5a, the multi-frame 8 having inner leads 8a and outer leads 8b, (step S21 in FIG. 27).

As to the structure of the lead frame 6, it is the same as that described above in the first embodiment.

On the other hand, as in step S22, there is provided a semiconductor chip 2 with salient electrodes 10 such as gold bumps or solder bumps attached beforehand to bonding pads 2a.

Subsequently, there is performed a die bonding shown in step S23 in which the salient electrodes 10 on the bonding pads 2a of the semiconductor chip 2 and corresponding inner leads 8a are connected together. More specifically, inner end portions of the inner leads 8a are arranged on and in opposition to the main surface 2b of the semiconductor chip 2 and thereafter the salient electrodes 10 and corresponding inner leads 8a are connected together electrically.

As a result, the inner leads 8a and the semiconductor chip 2 are connected together through the salient electrodes 10.

Subsequently, there is performed heat spreader bonding as in step S24. First, conductive members 16 such as gold bumps or solder bumps are connected to the inner leads 8a for ground (GND) and then a rear surface 2c of the semiconductor chip 2 and the chip supporting surface 5a formed in a recess 5e of the heat spreader 5 are bonded together through a chip bonding material 9. At this time, the conductive members 16 and an upper surface 5f of the protruding portion 5c of the heat spreader 5 are also bonded together.

Thereafter, by the same manufacturing method for the QFP 1 shown in FIG. 6 in the first embodiment, there are successively conducted the supply of a sealing material (sealing resin) shown in step S25, molding of step S26, tiebar cutting of step S27, plating of step S28, cutting/forming of step S29, and completion of external form shown in step S30, to assemble the QFP 17, followed by customer substrate mounting as in step S31.

There may be adopted a modification wherein before bonding the semiconductor chip 2 with salient electrodes 10 attached thereto beforehand to the inner leads, the rear surface 2c of the semiconductor chip 2 and the chip supporting surface 5a of the heat spreader 5 are first bonded together to bond the chip and the heat spreader with each other and thereafter the salient electrodes 10 on the chip and the inner leads 8a are connected together.

According to the QFP 17 of the second embodiment shown in FIG. 25 there can be obtained the same effect as that obtained by the QFP 1 of the first embodiment shown in FIG. 6.

Next, a description will be given below about a modified QFP 17 of the second embodiment, which is shown in FIG. 26.

The QFP 17 shown in FIG. 26 is constructed such that in the QFT 17 shown in FIG. 25, a still higher stepped portion 5i is formed outside (at portion "E" in FIG. 26) the bonded portion of the upper surface 5f of the protruding portion 5c in the heat spreader 5 bonded with the conductive members 16.

The stepped portion 5i relieves the stress induced by a difference in thermal expansion coefficient between the heat spreader 5 and the sealing resin, so that it is possible to diminish the stress imposed on the conductive members 16 and improve the connection life of the conductive members 16.

The manufacturing method for the QFP 17 shown in FIG. 26 is the same as that for the QFP 17 shown in FIG. 25.

Although the present invention has been described concretely by way of embodiments thereof, it goes without saying that the present invention is not limited to those embodiments, but that various changes may be made within the scope hot departing from the gist of the invention.

For example, although it has been described that in the QFP 1 of the first embodiment shown in FIG. 4, the height (t2) of the protruding portion 5c is preferably larger than the thickness (t1) of the chip bonding material 9 (t1<t2), the relation of t1<t2 is applied to all of the QFPs 1 and 17 associated with the first and second embodiments.

However, the relation in question may be t1>t2, and even with t1>t2, there can be obtained the effect of relieving the stress imposed on the end portion of the chip bonding material 9.

Moreover, although in the QFP 1 of the first embodiment shown in FIG. 4, the protruding portion 5c is formed in the shape of a frame around the chip, the protruding portion 5c is not always required to be a continuous frame-like projection in all of the QFPs 1 and 17 described in connection with the first and second embodiments. There may be broken-off portions partially (for example at corners).

Thus, no special limitation is placed on the shape of the protruding portion 5c of the heat spreader 5 insofar as the shape adopted is convex upward from the chip supporting surface 5a and is formed around the semiconductor chip 2.

It is not always necessary for the heat spreader 5 to be formed of copper or copper alloy. The material thereof is not specially limited insofar as it is high in thermal conductivity.

Although the semiconductor devices of the above first and second embodiments are QFPs 1 and 17, respectively, there is made no limitation to the QFPs 1 and 17, but the semiconductor according to the present invention may be another form, e.g., QFJ (Quad Flat J-leaded Package), insofar as it has a heat spreader 5 having a protruding portion 5c and exposed to a rear surface 3b of a resin body 3.

The following is a brief description of effect attained by typical inventions disclosed herein.

Since a protruding portion is formed around the chip on the chip mounting portion (heat spreader) of a high heat radiation type semiconductor device, it is possible to relieve the stress imposed on an end portion of the chip bonding material and hence possible to improve the reliability of the semiconductor device.

What is claimed is:

1. A semiconductor device comprising:
 a semiconductor chip having a main surface and a rear surface on the side opposite to the main surface, with a semiconductor element and a plurality of banding pads being formed on the main surface;
 a plurality of inner loads arranged along a periphery of the semiconductor chip;
 a plurality of bonding wires which connect the plural bonding pads and the plural inner leads electrically with each other;
 a chip mounting portion having a chip supporting surface for supporting the semiconductor chip end a rear surface located on the side opposite to the chip supporting surface and exposed to the exterior;
 a chip bonding material disposed between the chip supporting surface and the rear surface of the semiconductor chip to bond the semiconductor chip and the chip mounting portion with each other;
 a resin body which seals the semiconductor chip, the plural inner leads, the plural bonding wires, and the chip supporting surface of the chip mounting portion; and
 a plurality of outer leads integral with the plural inner leads and projecting to the exterior from the resin body,
 wherein a protruding portion protruding from the chip supporting surface is formed in a frame shape along the periphery of the semiconductor chip on the chip supporting surface of the chip mounting portion.

2. A semiconductor device according to claim 1, wherein the height of the protruding portion in the chip mounting portion from the chip supporting surface is larger than the thickness of the chip bonding material.

3. A semiconductor device according to claim 1, wherein the distance of the protruding portion in the chip mounting portion from an end portion of the semiconductor chip is shorter than the distance from the protruding portion to an end portion of the chip mounting portion.

4. A semiconductor device according to claim 1, wherein the protruding portion has substantially parallel inner wall and outer wall surfaces.

5. A semiconductor device comprising:
- a semiconductor chip having a main surface and a rear surface on the side opposite to the main surface, with a semiconductor element and a plurality of bonding pads being formed on the main surface;
- a plurality of inner leads arranged along a periphery of the semiconductor chip;
- a plurality of bonding wires as connecting members which connect the plural bonding pads and the plural inner leads electrically with each other;
- a chip mounting portion having a chip supporting surface for supporting the semiconductor chip and a rear surface located on the side opposite to the chip supporting surface and exposed to tho exterior;
- a chip bonding material disposed between the chip supporting surface and the rear surface of the semiconductor chip to bond the semiconductor chip and the chip mounting portion with each other;
- a resin body which seals the semiconductor chip, the plural inner leads, and the plural bonding wires, the resin body having a chip side sealing portion disposed sideways of the semiconductor chip; and
- a plurality of outer leads integral respectively with the plural inner leads and projecting to the exterior from the resin body;
- wherein a protruding portion protruding from the chip supporting surface is formed in a frame shape along the periphery of the semiconductor chip on the chip supporting surface of the chip mounting portion.

6. A semiconductor device according to claim 5, wherein the height of the protruding portion in the chip mounting portion from the chip supporting surface is larger than the thickness of the chip bonding material.

7. A semiconductor device according to claim 5, wherein the distance of the protruding portion in the chip mounting portion from an end portion of the semiconductor chip is shorter than the distance from the protruding portion to an end portion of the chip mounting portion.

8. A semiconductor device according to claim 5, wherein the protruding portion in the chip
   mounting portion it formed from the outside of the chip side sealing portion up to an end portion of the chip mounting portion.

9. A semiconductor device according to claim 5, wherein the chip mounting portion is formed of copper or copper alloy.

10. A semiconductor device according to claim 5, wherein the protruding portion has substantially parallel inner wall and outer wall surfaces.

* * * * *